(12) United States Patent
Cleveland et al.

(10) Patent No.: US 9,058,876 B2
(45) Date of Patent: Jun. 16, 2015

(54) METHODS AND CIRCUITS FOR BULK ERASE OF RESISTIVE MEMORY

(71) Applicant: 4D-S, LTD., Perth (AU)

(72) Inventors: Lee Cleveland, Santa Clara, CA (US); Franz Michael Schuette, Colorado Springs, CO (US)

(73) Assignee: 4D-S, LTD, Perth (AU)

( * ) Notice: Subject to any disclaimer, the term of this patent is extended or adjusted under 35 U.S.C. 154(b) by 0 days.

(21) Appl. No.: 13/924,244

(22) Filed: Jun. 21, 2013

(65) Prior Publication Data

US 2014/0376299 A1    Dec. 25, 2014

(51) Int. Cl.
| | |
|---|---|
| *G11C 13/00* | (2006.01) |
| *G11C 16/14* | (2006.01) |
| *G11C 5/06* | (2006.01) |
| *G11C 5/02* | (2006.01) |

(52) U.S. Cl.
CPC ........ *G11C 13/0097* (2013.01); *G11C 13/0007* (2013.01); *G11C 2213/71* (2013.01); *G11C 2213/77* (2013.01); *G11C 5/06* (2013.01); *G11C 13/0002* (2013.01); *G11C 5/02* (2013.01); *G11C 5/025* (2013.01)

(58) Field of Classification Search
CPC ............ G11C 5/02; G11C 5/025; G11C 5/06; G11C 2213/71; G11C 13/0007; G11C 13/0002; G11C 13/0097; G11C 2213/77

USPC ..................... 365/148, 163, 51, 63
See application file for complete search history.

(56) References Cited

U.S. PATENT DOCUMENTS

| | | | | |
|---|---|---|---|---|
| 5,842,170 | A  * | 11/1998 | Daberko et al. | 704/278 |
| 2003/0218905 | A1* | 11/2003 | Perner et al. | 365/173 |
| 2004/0088471 | A1* | 5/2004 | Perner et al. | 711/1 |
| 2010/0165714 | A1* | 7/2010 | Wu et al. | 365/163 |
| 2012/0170361 | A1* | 7/2012 | Ranjan et al. | 365/171 |
| 2012/0198174 | A1* | 8/2012 | Nellans et al. | 711/133 |
| 2012/0203986 | A1* | 8/2012 | Strasser et al. | 711/158 |
| 2013/0003457 | A1* | 1/2013 | Wood et al. | 365/185.03 |
| 2013/0046918 | A1* | 2/2013 | Im | 711/103 |
| 2013/0282963 | A1* | 10/2013 | Ranjan et al. | 711/103 |

* cited by examiner

*Primary Examiner* — Ly D Pham
(74) *Attorney, Agent, or Firm* — Kilpatrick Townsend & Stockton LLP

(57) ABSTRACT

A resistive random access memory integrated circuit for use as a mass storage media and adapted for bulk erase by substantially simultaneously switching all memory cells to one of at least two possible resistive states. Bulk switching is accomplished by biasing all bottom electrodes within an erase area to a voltage lower than that of the top electrodes, wherein the erase area can comprise the entire memory array of the integrated circuit or else a partial array. Alternatively the erase area may be a single row and, upon receiving the erase command, the row address is advanced automatically and the erase step is repeated until the entire array has been erased.

10 Claims, 9 Drawing Sheets

METHODS AND CIRCUITS FOR BULK ERASE OF RESISTIVE MEMORY

CROSS-REFERENCES TO RELATED APPLICATIONS

This application is related to U.S. patent application Ser. No. 13/396,404 filed Feb. 14, 2012, which claims priority under 35 U.S.C. §371 to PCT Application No. PCT/US2010/045667, filed on Aug. 16, 2010, which in turn claims priority under 35 U.S.C. §119(e) to U.S. Provisional Application No. 61/234,183, filed on Aug. 14, 2009. This application is also related to U.S. patent application Ser. No. 13/841,147 filed Mar. 15, 2013, which claims priority under 35 U.S.C. §119(e) to US Provisional Application No. 61/666,933 filed on Jul. 2, 2012. The disclosures of the above mentioned applications are all incorporated by reference herein in their entirety for all purposes.

BACKGROUND OF THE INVENTION

The present invention generally relates to non-volatile memory components used in computer and other processing apparatus for permanent storage of data. More particularly, this invention relates to resistive memory devices and a process of secure erasing of all data stored thereon through specific commands.

Mass storage devices such as advanced technology attachment (ATA) or small computer system interface (SCSI) drives are rapidly adopting non-volatile solid-state memory technology such as flash memory or other emerging solid-state memory technology, including phase change memory (PCM), magnetoresistive random access memory (MRAM), ferromagnetic random access memory (FRAM), organic memories, or nanotechnology-based storage media such as carbon nano-fiber/nano-tube based substrates. Currently the most common technology uses NAND flash memory as inexpensive storage memory.

Despite all its advantages with respect to cell density and cost per bit, flash memory is approaching its limit with respect to scalability. More precisely, during each program or erase cycle (P/E cycle) the dielectric layer separating the floating gate from the substrate deteriorates as a consequence program or erase mechanism used such as Fowler Nordheim tunneling or direct tunneling or hot carrier injection of either holes or electrons to the point where the cells become unreliable with respect to data retention or else can no longer be programmed or erased. Previous generations of flash memory based on single level cell (SLC) technology were able to withstand approximately 100,000 program and erase (P/E) cycles. However, with the migration to multi-level cell technology (MLC) and smaller process geometries, this write-endurance number has declined dramatically to roughly 3-5,000 cycles, depending among other things on the amount of parity information used for error correction.

The next step in the evolution of NAND flash memory, encompassing the introduction of three bits per cell (TLC NAND flash) and further shrinking of the process geometry to the 1xnm process node has exacerbated the existing problems in that the write endurance further decreased below the 1,000 P/E cycle threshold. More importantly, additional problems started to surface in the form of capacitive coupling of word lines also referred to as word line shorting, which can render entire pages inaccessible. Aside from the other, already mentioned drawbacks, the latest generations of NAND flash also suffer from greatly reduced data retention. Depending on the specific class of flash (MLC, eMLC or TLC), data retention can be as short as 3 months.

Lower reliability may be compensated for by increasing the overall capacity of a storage device, and thereby decreasing the number and frequency of write accesses at any given cell—as long as failure is predictable and the necessary countermeasures can be taken. Nothing, however, protects the user from the "sudden death" of NAND storage devices, meaning that massive catastrophic failures may occur without any pre-warning.

Given the increasing problems of NAND flash with respect to reliability, which require ever increasing complexity of countermeasures, it is clear that alternative non-volatile memory technologies need to be developed. Aside from the aforementioned technologies, the probably most viable candidate for the next generation non-volatile or permanent memory is resistive random access memory (ReRAM).

Secure or Bulk Erase

Permanent memory is a relatively new term used in the industry to describe memory with data retention lower than a non-volatile memory. In the context of this invention permanent memory refers to data retention in the order of 1000 hours. While non-volatility or permanence of data is required for data storage, it also raises security issues in that data may fall into the wrong hands. Accordingly, one of the requirements for non-volatile and permanent memory-based storage alike, at least in enterprise applications and wherever security is an issue is the requirement for secure erase.

Secure erase is important in several different scenarios. Particularly in military applications or else in situation where user data bases may be compromised, it is mandatory that any storage media can be completely wiped of user data. Another application for Secure Erase relates to RAID configurations, where a specific drive may be assigned a specific logical unit number in an array. If the array is dismantled without clearing the configuration data on the drive, the drive may not be accessible for normal operation by a host bus adapter unless all data are cleared.

Depending on the standard applied, the storage device needs to be able to execute a command for secure erase resulting in anything from a complete invalidation of data stored in the non-volatile semiconductor memory to a complete, non-recoverable erasure of all bits stored within the array. In the case of NAND flash memory, its base architecture is as groups of daisy chained floating gate transistors lends itself to this type of fast bulk erase. Specifically, one of the limitations of NAND (and also NOR) flash memory is that the smallest erasable unit is a block, which, however, has significant drawbacks for the operation of the memory device, particularly with respect to space reclamation. In this case, erasing is done on a per-block basis by applying a high positive voltage to the substrate to generate a strong electrical field, which non-specifically draws electrons out from the floating gate of all cells into the substrate, thereby erasing all cells within a block. This non specific brute force quantum tunneling approach greatly speeds up the process, albeit at a highly inflated power envelope of approximately 100 pJ of energy per bit and still requiring up to 2,500,000 nanoseconds to complete the erase of one block while physically damaging the floating gate transistor's oxide layer.

ReRAM arrays, in contrast, are typically organized similar to DRAM arrays, meaning that individual cells are accessed for read, erase or rather overwrite, by applying a programming voltage on a per cell basis, thereby providing much better granularity for management of data. In the case of DRAM-based storage devices, there is no need for any Secure Erase since the memory itself is volatile, meaning that there is hardly any data retention.

ReRAM combines the granularity of DRAM data access with data retention in the order of 1,000 hours or greater. The access granularity, on the other hand, does not typically allow for a global or bulk erase of all cells within the array, thereby creating a risk for leaking of sensitive data in a variety of scenarios. For the purpose of security in mass deployment of ReRAM as non-volatile or permanent storage media, a mechanism and method for fast bulk erase with a low energy budget would, therefore, be highly desirable.

BRIEF DESCRIPTION OF THE INVENTION

The present invention discloses a resistive random access memory integrated circuit (ReRAM IC) having an array of memory cells and being adapted for use as a mass storage memory in a solid state mass storage device, The ReRAM IC is further adapted for rapid bulk erase of all data stored therein by switching all cells in at least an area of the array substantially simultaneously to the same of at least two resistive states. The resistive element of the memory cells comprises a metal oxide hetero-junction substrate coupled to a top electrode and a bottom electrode wherein the top electrode is connected to one of a first group of metal lines adapted to sense resistance across the cell, for illustrative purposes herein referred to as word line, and the bottom electrode is connected to one of a second group of metal lines adapted to supply a voltage, for illustrative purposes herein referred to as bit line. Each word line is connected to a number of cells defining a page of the ReRAM array.

In one embodiment, an erase command is issued by the memory controller of the mass storage device and in response to the command all bit lines in at least an area of the memory array are selected and connected to ground or a first voltage. A second voltage which is higher than the first voltage is applied to all word lines within the area, causing all metal oxide hetero junctions to switch to the high resistance state by attracting the negatively charged oxygen ions and repelling the positively charged oxygen vacancies.

The erase area can comprise a layer within a 3D stack of memory cells. Alternatively, the area may comprise a bank of the array, wherein the bank may comprise of a group of wordlines, a sector, or a group of sectors. In order to minimize peak erase current, the erase area may also comprise at least one page selected by the row address of at least one word line and the row address is advancing automatically from an initial address until all row addresses within the ReRAM IC or a predefined part thereof have been selected and biased to the second voltage, resulting in switching all memory cells to the high resistance state. This method of utilizing the address to advance automatically may be applied to bulk erase by the full mass storage device, by individual memory IC's, by layer within each IC, by group of sectors within a layer, by sector, by page or by wordline.

According to a second embodiment of the invention a method is performed for bulk erase of data stored within a ReRAM IC. The ReRAM IC comprises an array of memory cells and can be bulk-erased by switching all memory cells therein to one of at least two resistive states.

The resistive element of the memory cells comprises a metal oxide hetero-junction substrate coupled to a top electrode and a bottom electrode wherein the top electrode is connected to one of a first group of metal lines adapted to sense resistance across the cell, for illustrative purposes referred to as word lines, and the bottom electrode is connected to one of a second group of metal lines adapted to supply a voltage, for illustrative purposes referred to as bit lines. Each word line is connected to a number of cells defining a page of the ReRAM array.

When an erase command is issued by the memory controller of the mass storage device all bit lines in at least an area (erase area) of the memory array are selected and shorted to ground or biased to a first voltage. A second voltage which is higher than the first voltage is applied to all word lines within the area, causing all metal oxide hetero junctions to switch to the high resistance state by attracting the negatively charged oxygen ions and repelling the positively charged oxygen vacancies, thereby enabling significant recombination of oxygen and vacancies to form a high resistance interface.

The erase area can comprise the entire ReRAM IC, in which case it may be advantageous to stagger the erase command to different ReRAM ICs in a mass storage device containing a plurality of ReRAM ICs in order to balance the erase current over time.

In a different aspect of the invention, the erase area can comprise a layer within a 3D stack of memory cells; alternatively, the area may comprise a bank of the array. In order to minimize peak erase current, the erase area may also comprise at least one page selected by the row address of at least one word line and the row address is advancing automatically from an initial address until all row addresses within the ReRAM IC or a predefined part thereof have been selected and biased to the second voltage, resulting in switching all memory cells to the high resistance state

DETAILED DESCRIPTION OF THE INVENTION

Resistive Random Access Memory (ReRAM)

The current invention discloses a ReRAM-based non-volatile memory IC configured for fast and complete bulk erase of data. In general, the term ReRAM (or RRAM) describes two different functional types of solid state memory using a metal-oxide-metal structure. The first mechanism relies on binary oxides in a filamentary mechanism requiring a relatively high electrical field to form defects in the oxide-based insulator and thereby creating a conductive filament. Drawbacks of this mechanism are non-uniformity of the filaments across the cells as well as high current in the ON state.

Figure 1:
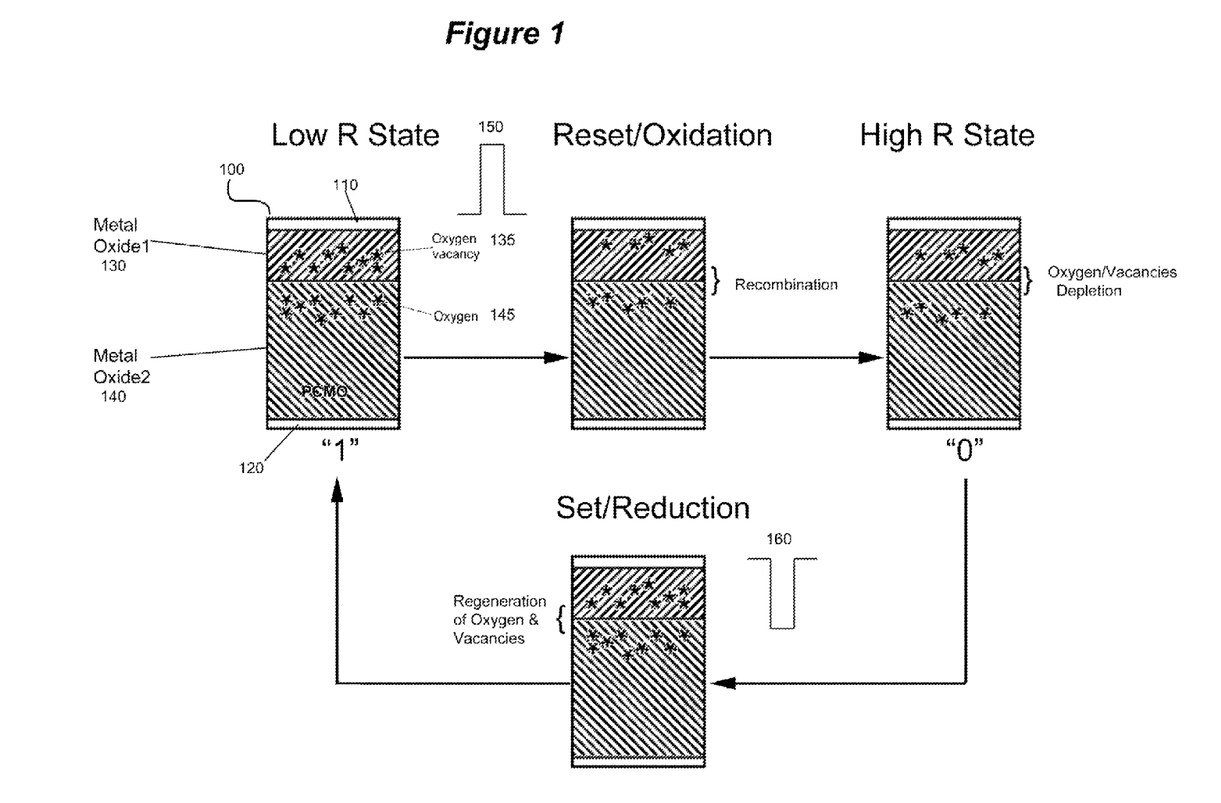
FIG. 1 shows an exemplary PCMO-based ReRAM element and its programming to a high or low resistance state

The second, non-filamentary mechanism to achieve ReRAM functionality employs multi-component oxides that are electron-correlated systems. The mobile components inducing the switching from the ON to the OFF state or vice versa are thought to be oxygen ions 135 or oxygen vacancies 145 as shown in FIG. 1, the redistribution of which leads to a valence change in the metal and, thereby, a resistance change in the cell. ReRAM is currently targeting data retention of several years which is well above the 1000 hr target for permanent memory; moreover, estimated write-endurance is in the order of $10^{12}$ cycles. Finally, metal oxide hetero-junction (MOHJO) based, non-filamentary ReRAM can be programmed in approximately 10 nanoseconds at an average power envelope of 0.1-3 pJ per cell.

The current disclosure discusses specific examples of the second mechanism but may be applied to either types of ReRAM or yet other types of ReRAM not mentioned here.

Materials of choice for non-filamentary mechanism-based ReRAM may comprise metal oxides as an example but are not limited to Praseodymium-Calcium-Magnetite (PCMO) or Lanthanum-Strontium-Magnetite (LSMO) but other, multi-component oxides, such as oxides of Tungsten Tin or Indium Tin are considered as well. Within the group of possible non-filamentary ReRAM mechanisms, a further separation into cells using electrochemically similar metals for the top and bottom electrode (Type I devices) or else using a top electrode with a Gibbs free energy lower than that of the PCMO layer and that of the bottom electrode which may, in a non-limiting example, be platinum (Pt)-based. The latter type (Type II) is also referred to as Metal Oxide Hetero-Junction-Operation (MOHJO) mechanism. Commonalities of most non-filamentary ReRAM systems are easy manufacturability through vapor deposition, resulting in uniform and controlled layers at temperatures compatible with back-end-of-line CMOS compatible process. A further advantage is the possibility of 3-dimensional (3D) stacking, which allows for scaling down the average cell size to less than $4\ F^2$.

FIG. 1 shows a ReRAM cell 100 are based on the MOHJO mechanism, wherein a top electrode 110 with a lower (more negative) Gibbs free energy is deposited atop of a second metal oxide 140 layer, such as PCMO with a higher Gibbs free energy. The second metal oxide layer 140 is in contact with a bottom electrode 129. During deposition, top electrode 110 may spontaneously form a first metal oxide layer 130. Alternatively the first metal oxide layer 130 may be deposited separately from the top metal electrode 110, wherein the Gibbs free energy of oxidation for the first metal oxide 130 (rather than the top electrode 110) is lower than the Gibbs free energy of the second metal oxide 140.

Oxygen vacancies 135 and oxygen ions 145 may be present in the first metal oxide 130 and the second metal oxide 140, which may be due to the Gibbs free-energy of oxidation difference between the two oxides. Alternatively, initial oxygen vacancies or ions may be introduced by processing or post processing methods. For example. Oxygen vacancies may be introduced by deposition of the first metal oxide 130 in oxygen-poor environment.

Oxygen vacancies 135 and oxygen ions 145 are the mobile elements that are recombining after applying a negative voltage pulse 150 to the bottom electrode 120. The negative voltage pulse 150 repeals oxygen anions (135) and attracts positively charged oxygen vacancies 135. The resulting depletion of oxygen anions 145 and vacancies 135 at the interface between the first (130) and second metal oxide layer (140) induces a high resistance state. Conversely, a positive voltage pulse 160 applied to the bottom electrode 120 results in regeneration of oxygen ions 135 and vacancies 145 in the first 130 and second 140 metal oxide layers, respectively.

The recombination and regeneration is described in the prior paragraph with electrical bias applied at the bottom electrode but the same effect can be achieved by the oppositely charged bias on the top electrode. For example a positive bias applied to the top electrode can result in recombination.

Figure 2:
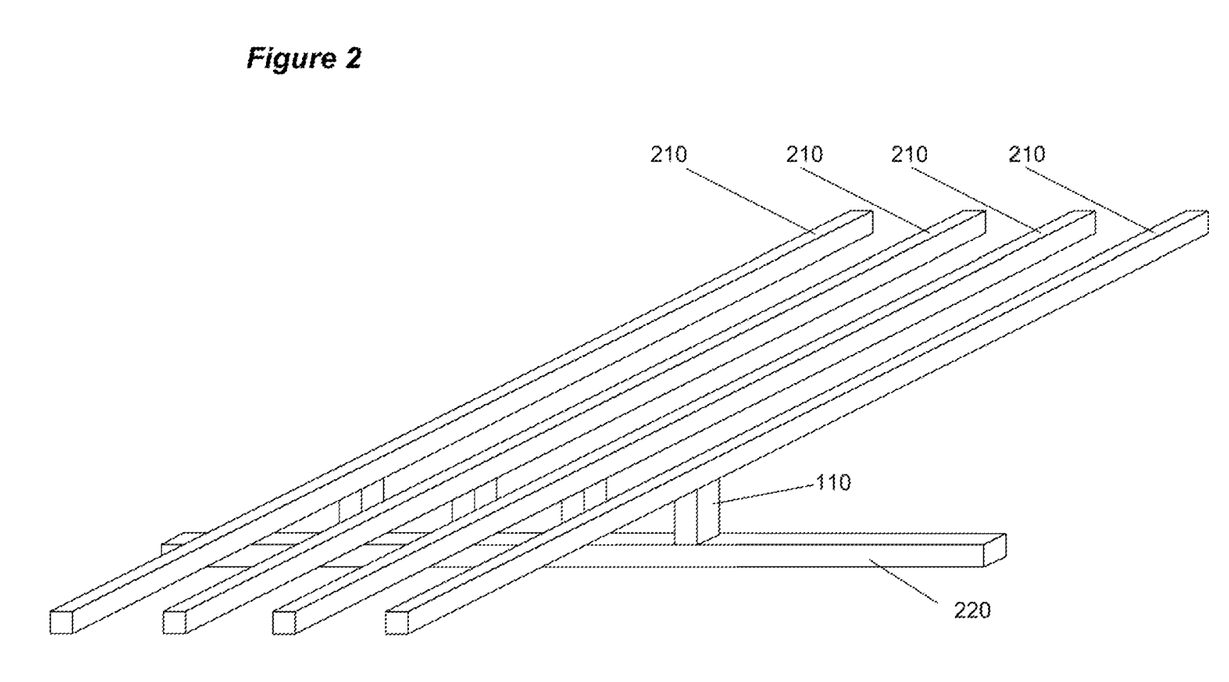
FIG. 2 shows a ReRAM memory cell connected to bit lines and a word line

Referencing FIG. 2, for convention purposes, the top electrode 110 (see FIG. 1) of the RRAM cell 100 may be connected to a word line (WL) 210 and the bottom electrode 120 (see FIG. 1) of the RRAM cell 100 is connected to a bit line (BL) 220 as known in the art from other memory array designs. All memory cells connected to a word line form a page, which can be any arbitrary size, non-limiting examples could be 512 bytes, 1 kByte, 4 kByte page size. However, this assignment is purely arbitrary and any other configuration of the addressing circuitry is possible.

For addressing individual cells of the ReRAM IC, a variety of configurations as known in the art are possible, including but not limited to an SRAM interface, a DRAM interface or a NAND flash interface adapted for page or sub-page transfer of data. Using an SRAM interface, also used in pseudo or 1T SRAM, row and column addresses are given simultaneously to allow instant access of any cell at the intersection of bit and word lines (broadside addressing), albeit at the expense of doubling the address pins. In a DRAM interface configuration row and column addresses are time-multiplexed over the same address pins but the decoders are switched internally depending on the state of the command signal pins. In a NAND flash interface, the addresses are embedded into the data packets and decoded internally into the appropriate block and page numbers.

Programming of a MOHJO-based memory cell from the OFF or reset state (high resistance state; HRS) to the ON or set state (low resistance state; LRS) is accomplished by applying a negative voltage pulse 160 to the word line or top electrode relative to the bit line or bottom electrode. Conversely, for resetting the memory cell to the HRS, the polarity of the voltage gradient between the WL and the BL is reversed by applying a positive voltage pulse 150 to the WL or else a negative voltage to the BL.

Switching from the LRS to the HRS requires lower energy than vice versa, therefore, the HRS is the preferred target for any bulk erase operation. In addition, switching from the HRS to the LRS state across an entire array would greatly increase the leakage current during the operation. Accordingly, the preferred target for any bulk or global erase operation will be the reset state across the entire array for the embodiments described in the present disclosure. However, this is a non-limiting description as the circuits and methods described can be application to HRS to LRS bulk erasure as well.

Figure 3:
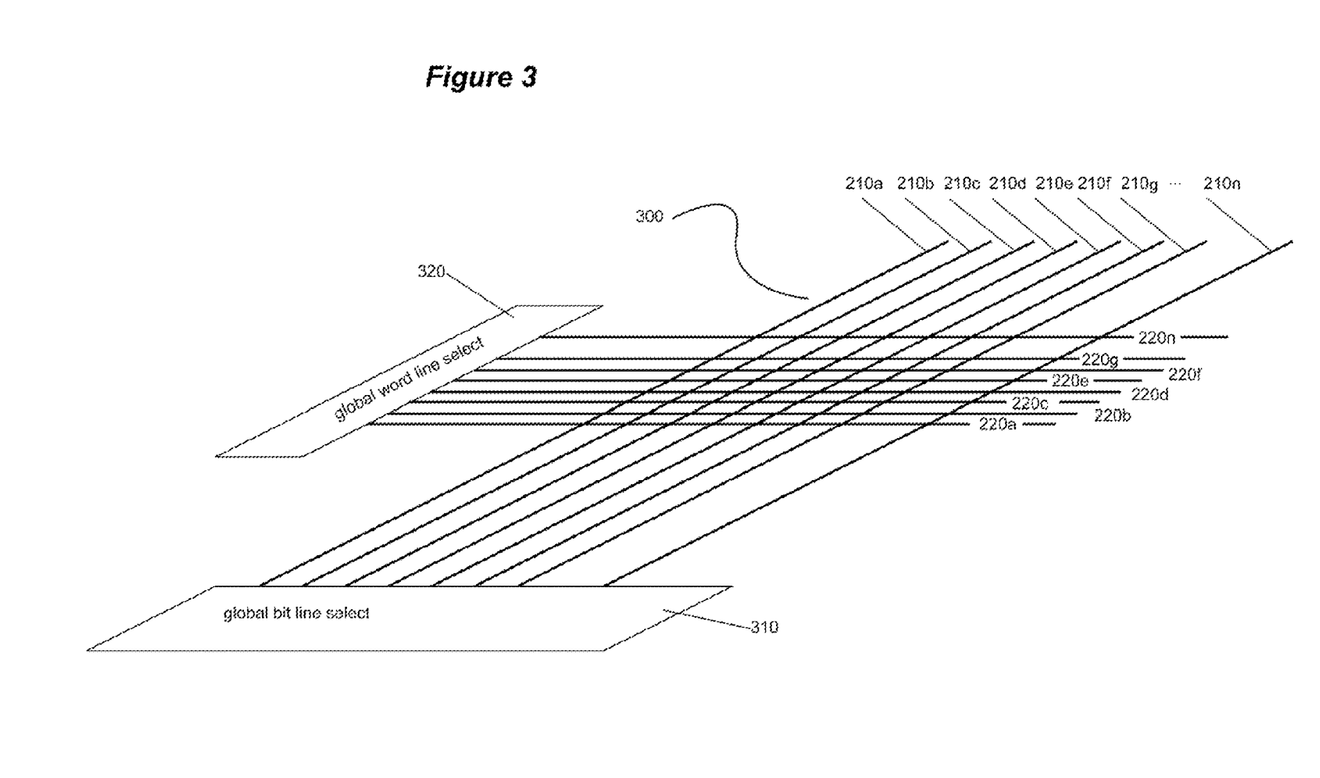
FIG. 3 shows global bit line select and global word line select circuitry connected to an array of bit lines and word lines

Referring now to FIG. 3, a group of wordlines and bitlines is shown, illustrating an example erase area 300. As previously described, the erase target group or erase area can be a page (wordline), a sector (group of wordlines), a group of sectors, a bank, a layer, a whole IC device or other. An exemplary erase sequence is described below with respect to the circuit layout of the RRAM array for the erase target group or selected erase area 300, shown in FIG. 3 as cells connected to bitlines connected a global bitline select circuitry 320 and wordlines connected to a global wordline select circuitry 310.

An erase command is received. After receiving an erase command, all bit lines are selected through a global bit line select circuitry 310, followed by selection of all word lines by a global word line select circuitry 320 within an erase target group or selected erase area. The select circuitry 310 or 320 may comprise a select transistor to connect the bit or word line to a supply voltage. An erase target group can be an arbitrary number of rows, a bank within the array or a layer in a 3D-stacked device. An erasing voltage establishing a positive voltage gradient against the selected bit lines is applied to all selected word lines causing erasing current to flow through all memory cells. Since the target is the HRS, the current flow is self limiting, in that all cells that are erased are switched to high internal resistance.

In an embodiment, an entire ReRAM containing IC is the target erase group. In this embodiment, all word lines and bitlines within the entire IC are selected simultaneously by the global bitline select circuitry 310 and global word line select circuitry 320 and applying the erase voltage pulse to the globally selected word lines, resulting in instantaneous (~10 nanoseconds) erasure of all stored data within the entire IC. Depending on the number cells present in the ReRAM IC, though, this erase may result in some high peak currents, especially in mass storage devices employing a plurality of ICs that may be subjected to simultaneous bulk erase. This full IC erase may be useful in cases where peak current is less of a concern, such as when the appliance or system is connected in external power rather than battery power.

In another embodiment, a controller of a mass storage device is configured to apply "staggered erase" commands to the individual ReRAM ICs used in the mass storage device. The mass storage device may comprise memory controllers, cache memory of the same or different IC as the mass storage memory IC, and other circuits, components or IC to optimize the performance of the mass storage device. The term mass storage device is defined as a device for storage of large amounts of data in a persisting and machine-readable fashion. In the context of staggered erase it further means that the mass storage device uses more than one mass storage memory IC, which is typically a solid state, non-volatile memory such as ReRAM, or NAND flash as data media on the device and at least some of the ICs can be accessed substantially simultaneously in a parallel manner by the controller.

In more detail, instead of erasing all ReRAM ICs of the mass storage device at the same time by issuing a global erase command that is received and executed by all ReRAM ICs simultaneously, the controller issues the erase command for each ReRAM IC individually with enough time offset to avoid overlap between erase execution of the ReRAM ICs in the device. This can be done for example by staggering the chip select or chip enable signal across the array of ReRAM ICs to only allow select decoding of the broadcasted erase command.

In yet another embodiment, the RRAM is configured to perform sequential erase of specific erase target areas within a ReRAM IC device. For example, an erase target area could be a layer within a 3D stacked ReRAM device, meaning that the bit line selection and the word line selection would be performed on a per layer basis. The actual selection of the respective bit lines and word lines may be done by the storage device controller or else by an internal logic within the ReRAM IC, based, for example on the layer address (e.g. layer 0, layer 1 etc.).

In a specific aspect of an embodiment, the erase target group may alternatively be a bank within a memory IC. The bulk erase may be executed where the individual banks are automatically and consecutively selected in a round-robin scheme by the internal logic of the ReRAM IC device. In this case, in order to minimize erase peak current, the erasing of a second bank may not start until the erasing of a first bank has completed.

Figure 4:
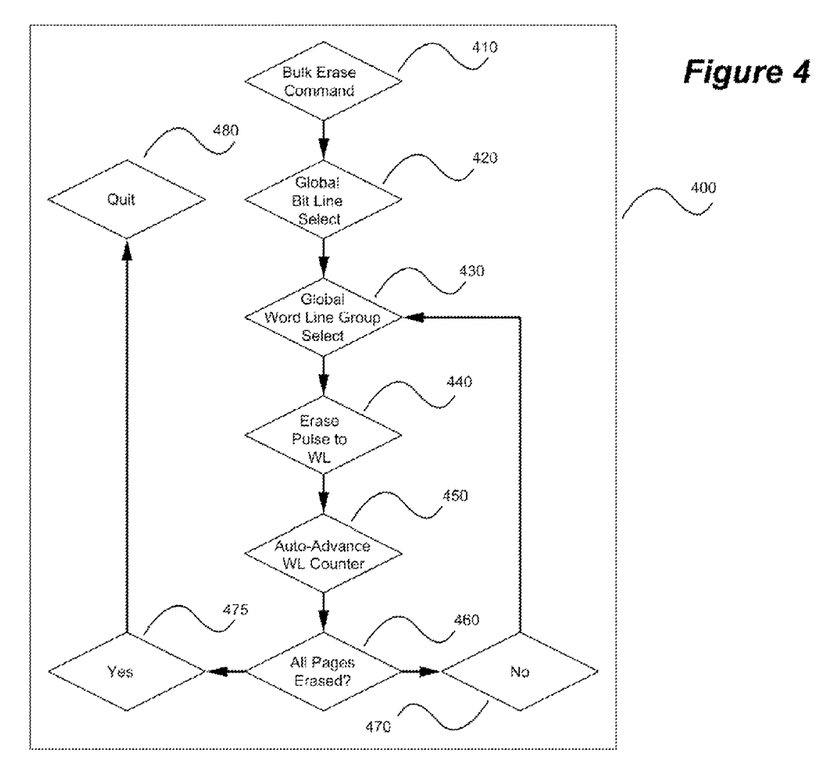
FIG. 4 shows an example flow diagram of the execution of a bulk erase command for erasing subsequent groups of memory pages with auto-advance of the WL counter.

In another specific aspect of this embodiment, shown as flow diagram in FIG. 4, the bulk erase process 400 comprises the following steps: Issuing a bulk erase command in a step 410, followed by a global bitline select upon which all bit lines of the bulk erase area are selected in a step 420. Subsequently one or more rows (or pages) within a bank are selected through the global selection of the respective word lines of an erase target area in a step 430 while keeping all bit lines selected.

Next, applying the erase voltage pulse to the selected word line or lines may take place in a step 440. Once the respective pages (each defined by a word line) are erased in step 440, the row address strobe (RAS) is automatically advanced in a step 450 to the next row or rows. A question of whether all pages are erased in a step 460 follows. If the answer is no, then the process continues 470 back to selecting wordline in step 430 until all pages have been erased in the answer 475 after which the memory IC may resume normal operation by quitting the bulk erase process in a step 480. The minimum target erase group in this case would be one page. In other embodiments the minimum target erase group may be larger.

The above description is based on conventional configuration, thus the bitlines are selected before the wordlines and the erasure occurs in a wordline by wordline basis. The same may be possible where all wordlines are selected first and then the erasure occurs in a bitline by bitline progression.

The erase process can start on any row within the bank; therefore, it is not necessary to move the address strobe to any specific start address, rather, the process starts at the row address where the strobe is parked from the last memory access. After reaching the highest row address, the strobe loops back to the lowest row address and continues until reaching the starting address for the erase cycle.

3-D Configuration

Figure 5:
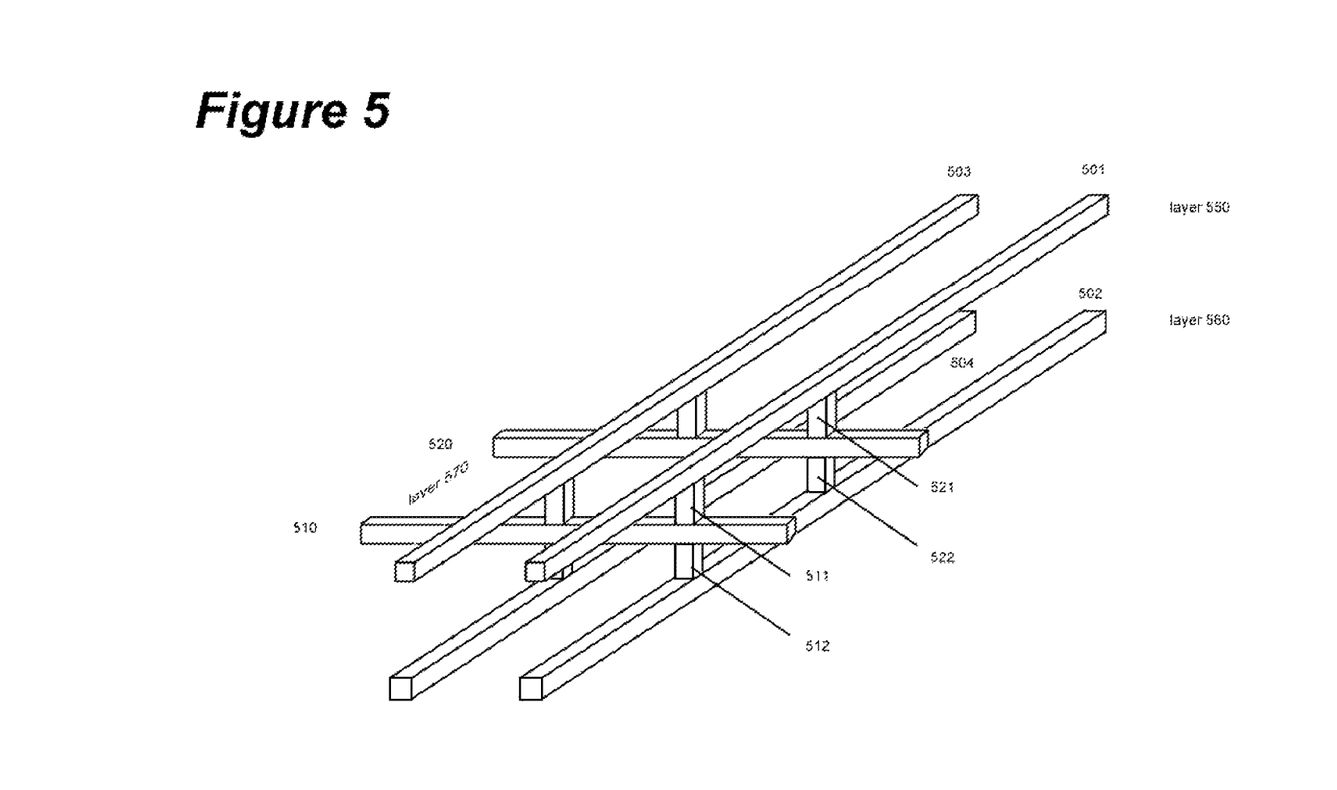
FIG. 5 shows a clam shell configuration with bit lines at the top and bottom and a central word line layer with upper and lower resistive memory cells at the intersection between bit lines and word lines.

As shown in FIG. 5, in a 3-D stack, mirror-symmetric configuration of odd bitline layer 550 comprising at least bitlines 501 and 503 and even bitline layer 560 comprising at least bit lines 502 and 504 may sandwich a first wordline layer 570 comprising at least word lines 510, 520 to form a "clamshell" around the word lines 510, 520. The memory cells 511, 512, 521, 522 and others are at the intersection of bitlines 501, 502, 503, and 504 and word lines 510, 520 as shown.

The erase process can be executed simultaneously for both odd bitline layer 550 and even bitline layer 560 if the bit lines in both layers are selected simultaneously. Alternatively, the erase can be done in a layer-by-layer sequence by selecting the odd bitline layer 550 with bitlines 501 and 503 to erase cells 511, 521, and others in the same layer followed by selecting the even bitline layer with lower bit lines 502, 504 and others in the same layer and applying the erase pulse to the word lines to erase cells 512, 522 and others in the same layer or vice versa. For both simultaneous and the layer-by-layer erase schemes, one, a group of, or all word lines of the sector may be selected in an erase target group.

Figure 7:
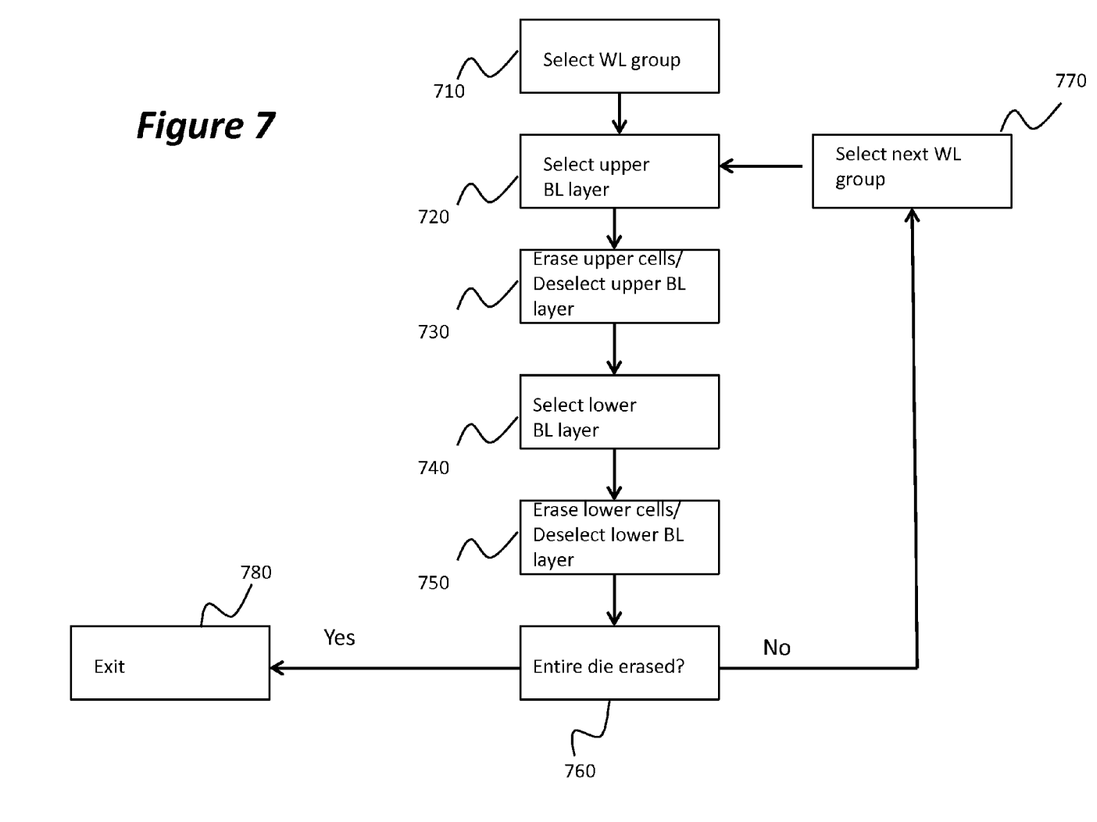
FIG. 7 shows an example flow diagram for consecutive bulk erase of the upper and lower layer of a clam shell configuration.

FIG. 7 shows a flow diagram of the erase sequence separately executed for upper and lower layers or odd and even bitline layers, in a clamshell configuration in sequential groups of word lines. The flow comprises a selecting wordline group in a step 710, a selecting upper bitline layer in a step 720, an erase upper cells and deselecting upper bitline layer in a step 730, a select the lower bitline layer in a step 740 and a erase lower cells and deselecting the lower bitline layer in a step 750. A decision step 760 follows where the question "is the entire die erased" is asked. If the answer is no, a selecting a next wordline group in a step 770 follows which leads back to step 720 for selecting the next upper bitline layer again. The flow diagram continues until a yes answer is achieved for the decision step 760 where the procedure exits in a step 780.

Figure 8:
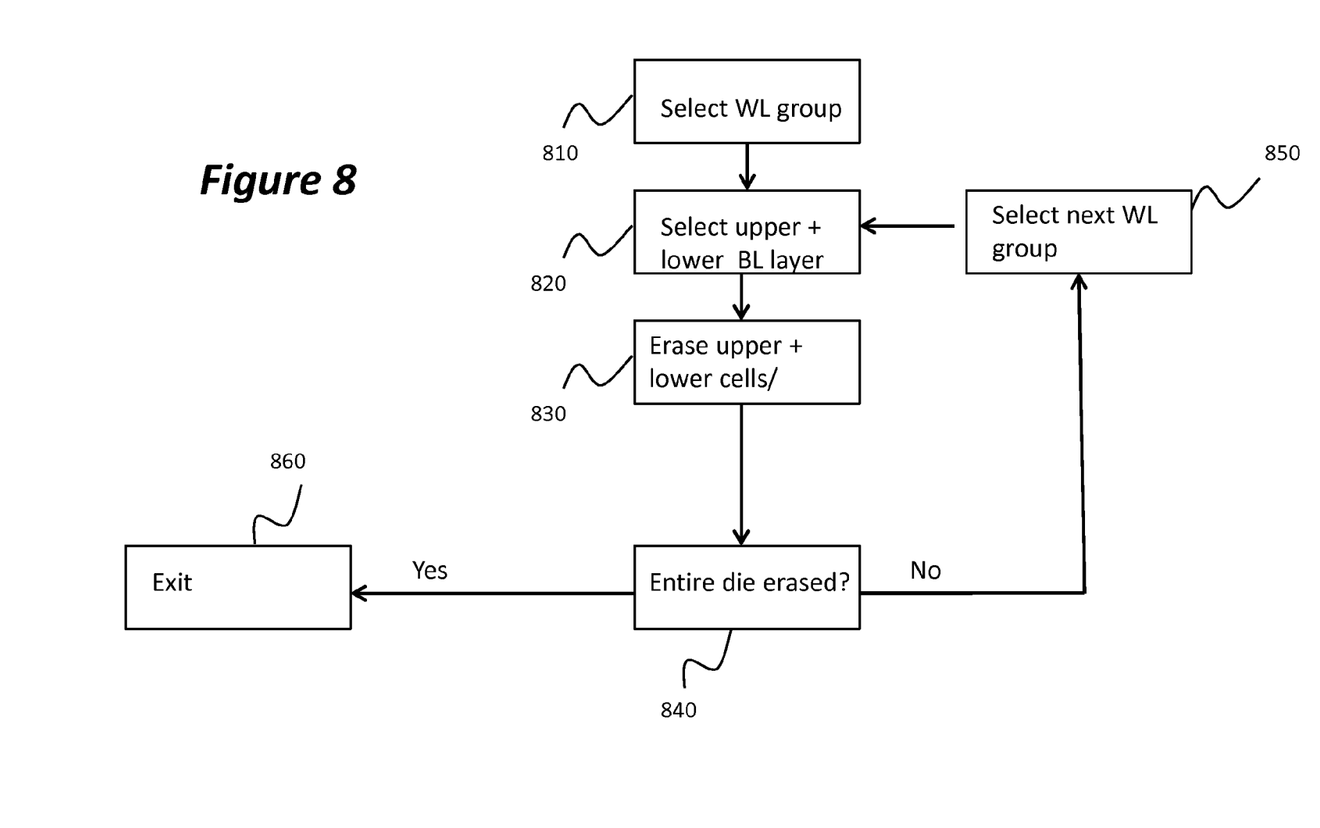
FIG. 8 shows an example flow diagram for the simultaneous bulk erase of upper and lower layers.

FIG. 8 shows a flow diagram of the erase sequence simultaneously executed in either upper and lower layers or odd and even bitline layers in a clamshell configuration in sequential groups of word lines. The flow comprises a selecting wordline group in a step 810, a selecting upper and lower bitline layers in a step 820, an erase upper and lower cells in a step 830, a decision step 840 follows where the question "is the entire die erased" is asked. If the answer is no, a selecting a next wordline group in a step 850 follows which leads back to step 820 for selecting the upper and lower bitline layer again. The flow diagram continues until a yes answer is achieved for the decision step 840 where the procedure exits in a step 860.

Figure 6A:
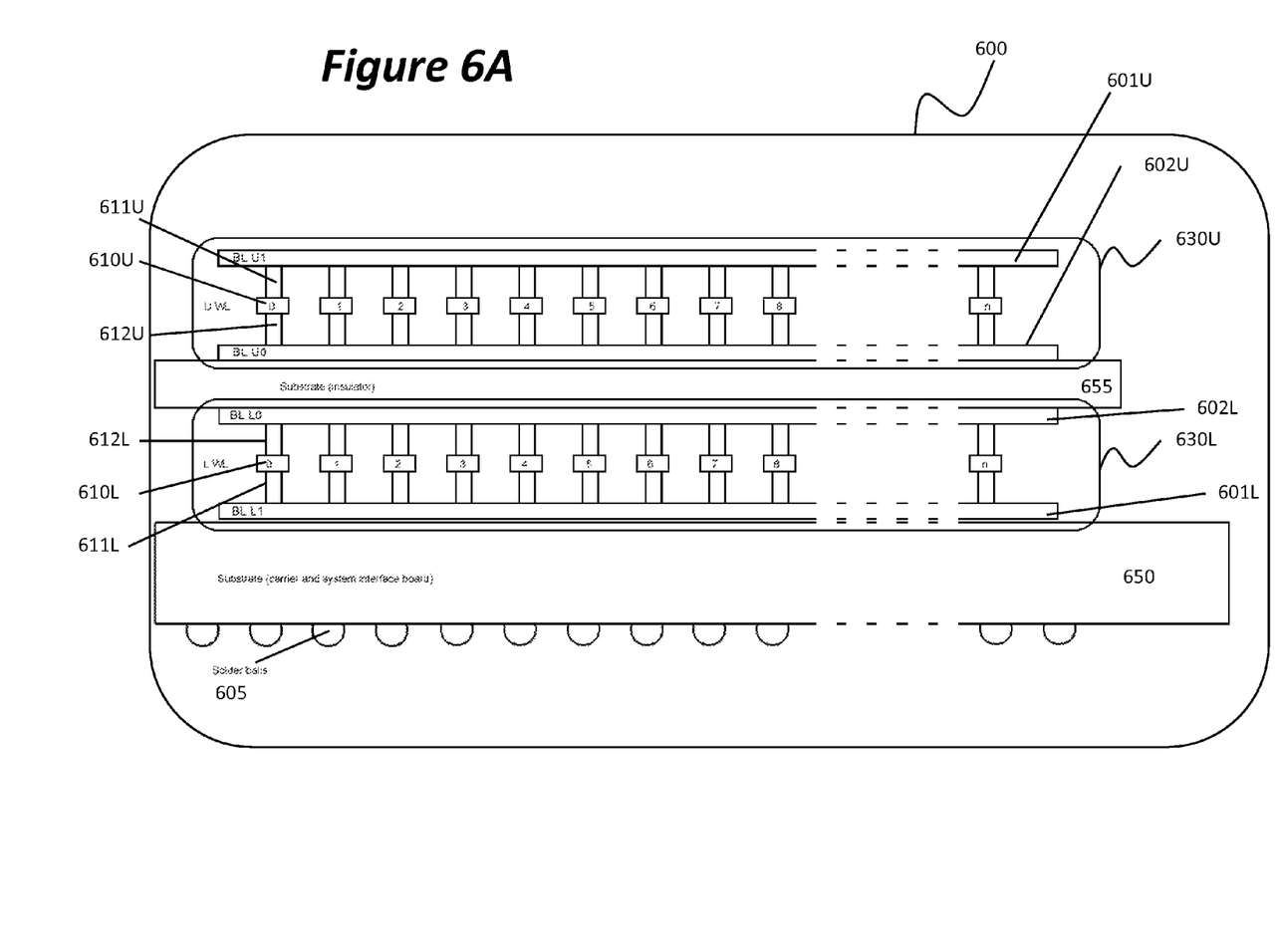
FIG. 6A shows a multi-clam shell stack with an upper and a lower clam shell separated by an insulating substrate.

Referring now to FIG. 6, a multi-stacked 3D configuration is shown having at least two clamshells, denoted by 630U and 630L stacked on top of each other. Bulk erase can be done in a round robin scheme (layer-by-layer or clamshell by clamshell) or by selecting all wordlines across all clamshells. Although only two clamshells are shown in the figure, the multi-stacked 3D configuration is applicable to any number of clamshells greater than two.

For example, the ReRAM IC 600 may have a carrier board 650 with solder balls 605 to provide signals and power from a host system. An upper clamshell 630U and a lower clamshell 630L contain the memory arrays comprising memory cells at the intersection between word lines and bit lines. In the upper clamshell, bit lines 601U and 602U intersect with word lines 610U with memory cells 611U and 612U at the cross points. In the lower clamshell, bit lines 601L and 602L intersect with word lines 610L with memory cells 611L and 612L at the cross points. The upper clamshell 630U and lower clamshell 630L may be attached via an insulator substrate 655.

In this configuration, the upper and lower clamshells constitute different dies that may be selected through individual chip select or chip enable signals. Any bulk erase, therefore, may be carried out simultaneously in both clamshells or else in a staggered (sequential) manner between upper and lower clamshell. Lower in this case indicating closer to a shared insulator substrate 655 and not necessarily physically below. Within each clamshell, the upper cells 611$x$ may be erased separately from the lower cells 612$x$ for the entire layer or an erase area within the area or else simultaneously for both layers.

Figure 6B:
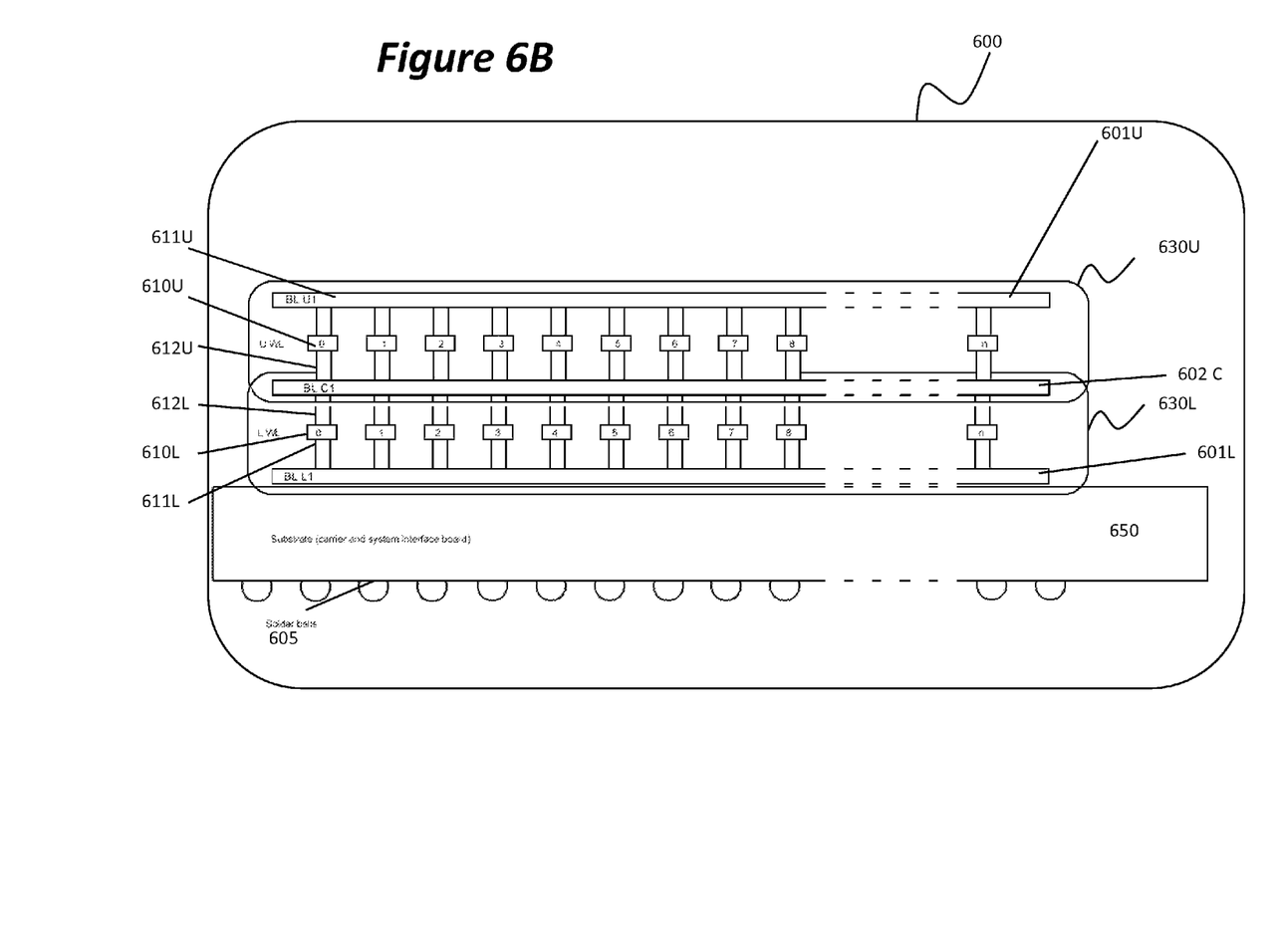
FIG. 6B shows a multi-clam shell stack with an upper and a lower clam shell sharing a common bit line layer.

In yet another embodiment, the upper and lower clamshells may share bitlines, thus creating a true 3-D, repeatable stack which may comprise from 2 to many thousands of clamshells with alternating bitline and wordline layers. Referring to FIG. 6$b$, the 3-D stack of this embodiment will not have the substrate 655 as compared to FIG. 6A but instead bitline UO 602L and bitline LO 602U from FIG. 6A would be a shared line 602C as shown in FIG. 6B between the upper and the lower clamshell. The same would be for each of the subsequent pairs of clamshells.

One advantage of any sub-die mode of erase, whether it is selection of upper vs. lower layer, scrolling through groups of word lines or a combination of both, is that the peak erase energy is kept very low; moreover, the thermal dissipation is evenly distributed across the array over the duration of the entire bulk erase. As a consequence, the bulk erase can be initiated globally for all ICs simultaneously by a simple command of the storage device controller similar to a CAS before RAS operation in DRAM. It should be noted that in this case, however, it is not an auto-refresh that is triggered but a bulk "auto-erase" sequence that will continue until all pages have been erased or power is interrupted. Given the fast programming time from a set to a reset state (approximately 10 ns) the entire process will still be terminated within a few microseconds (μsec) at most.

While certain components are shown and preferred for the bulk erase ReRAM IC of this invention, it is foreseeable that functionally-equivalent components could be used or subsequently developed to perform the intended functions of the disclosed components. Therefore, while the invention has been described in terms of some embodiments, it is apparent that other forms could be adopted by one skilled in the art, and the scope of the invention is to be limited only by the following claims.

The invention claimed is:

1. A resistive random access memory integrated circuit (ReRAM IC) having an array of memory cells and adapted for use as a mass storage memory and further adapted for rapid bulk erase of all data stored therein by switching all cells in at least an area of the array substantially simultaneously to the same of at least two resistive states, wherein the resistive element of the memory cells comprises a metal oxide hetero junction device coupled to a top electrode and a bottom electrode, wherein the top electrode is connected to one of a first group of metal lines adapted to sense resistance across the cell and the bottom electrode is connected to one of a second group of metal lines adapted to supply a voltage, wherein the metal lines of the first group are bit lines and the metal lines of the second group are word lines defining a page of memory cells, and wherein, upon receiving an erase command, all bit lines connecting to cells in the area are selected and all word lines connecting to cells in the area are selected; and, wherein a negative voltage relative to the voltage of the bit lines is applied to the word lines; and, wherein the applied voltage switches the metal oxide hetero junction substrate to a high resistance state.

2. The ReRAM IC of claim 1, wherein the area comprises a 3D-stacked layer of the memory array.

3. The ReRAM IC of claim 1, wherein the area comprises a bank within the memory array.

4. The ReRAM IC of claim 1, wherein the area comprises at least a first row and, wherein the row addresses are automatically advanced to a second row after completion of the erase of the first row.

5. The ReRAM IC of claim 4, wherein the word lines are selected by a row address strobe and the bit lines are selected by a column address strobe or a global select mechanism; and, wherein, pulling a column address select command line to a logical true state before the selection of a word line triggers the automatically advancing of the row address for the erasing of all data stored in the area.

6. A method for bulk erasing a resistive random access memory integrated circuit (ReRAM IC) having an array of memory cells and adapted for use as a mass storage memory by switching all cells in at least an area of the array substantially simultaneously to the same of at least two resistive states, wherein the resistive element of the memory cells comprises a metal oxide hetero junction substrate coupled to a top electrode and a bottom electrode, wherein the top electrode is connected to one of a first group of metal lines adapted to sense resistance across the cell and the bottom electrode is connected to one of a second group of metal lines adapted to supply a voltage, wherein the metal lines of the first group are bit lines and the metal lines of the second group are word lines defining a page of memory cells, and wherein, upon receiving an erase command, all bit lines connecting to cells in the area are selected and all word lines connecting to cells in the area are selected; and, wherein a negative voltage relative to the voltage of the bit lines is applied to the word lines; and, wherein the applied voltage switches the metal oxide hetero junction substrate to a high resistance state.

7. The method of claim 6, wherein the area comprises a 3D-stacked layer of the memory array.

8. The method of claim 6, wherein the area comprises a bank within the memory array.

9. The method of claim 6, wherein the area comprises at least a first row and, wherein the row addresses are automatically advanced to a second row after completion of the erase of the first row.

10. The method of claim 9, wherein the word lines are selected by a row address strobe and the bit lines are selected by a column address strobe or a global select mechanism; and, wherein, pulling a column address select command line to a logical true state before the selection of a word line triggers the automatically advancing of the row address for the erasing of all data stored in the area.

* * * * *